United States Patent [19]

Carter

[11] Patent Number: 4,459,452
[45] Date of Patent: Jul. 10, 1984

[54] BALL BONDING OF WIRE

[75] Inventor: Albert W. Carter, Stapleford, England

[73] Assignee: The Welding Institute, Great Britain

[21] Appl. No.: 277,870

[22] Filed: Jun. 26, 1981

[30] Foreign Application Priority Data

Jun. 30, 1980 [GB] United Kingdom ............... 8021382

[51] Int. Cl.³ .............................................. B23K 31/00
[52] U.S. Cl. .............................. 219/56.21; 219/56.22; 219/130.4
[58] Field of Search ............ 219/56, 56.1, 56.21, 219/56.22, 137 PS, 130.4, 113, 68

[56] References Cited

U.S. PATENT DOCUMENTS

| 2,759,088 | 8/1956 | Lincoln | 219/137 PS |
| 3,241,218 | 3/1966 | Phillips | 219/130.4 |
| 4,123,646 | 10/1978 | Keinanen | 219/130.4 |
| 4,323,759 | 4/1982 | Edson et al. | 219/137 PS |

FOREIGN PATENT DOCUMENTS

568656 10/1975 Switzerland ................... 219/68

Primary Examiner—C. C. Shaw
Attorney, Agent, or Firm—Martin Novack

[57] ABSTRACT

A method and apparatus for forming a ball on a wire by spark discharge and for bonding the wire to a microcircuit is disclosed. The apparatus includes an electrode, a wire holder supporting a wire and forming a spark discharge gap between the tip of the wire and the electrode, first and second D.C. supply circuits, and an arrangement for bringing the wire ball into contact with a microcircuit and bonding the ball to the microcircuit. The first supply circuit provides a higher voltage and lower current than the second supply circuit and includes a capacitor of smaller value and charging, discharging resistors of higher value than corresponding capacitors and resistors in the second circuit. A control circuit initially connects the higher voltage across the wire and electrode to initiate an arc discharge and thereafter connects the lower voltage source across the gap form the ball.

9 Claims, 4 Drawing Figures

OUTPUT WAVEFORMS TAKEN ACROSS A RESISTIVE LOAD.

*a*. INITIAL DISCHARGE SUPPLY.
*b*. POWER DISCHARGE SUPPLY.

BALL BONDING OF WIRE

This invention is concerned with the connection of a wire to a further component by ball bonding. Ball bonding may be used, for example, for the electrical interconnection of small components or circuits.

For very small circuits, for example for connecting integrated circuit silicon chips to substrate circuits, it has been customary to use aluminium wire or gold wire. Typically, such wire was of about 25 μm diameter.

In one known technique for gold-wire bonding, a ball was formed on the end of a gold wire and the gold ball was then connected to the silicon chip or substrate circuit by thermo-compression or ultrasonic bonding. The ball was formed by applying a hydrogen flame to the wire, or by creating a spark discharge between the wire and an electrode by applying a sufficient voltage (350 volts or over) between the gold wire and the electrode to cause a discharge to take place in the space between them. In another known technique, a wedge-shaped ultra-sonic tool was used to connect aluminium or gold wire to the pads on the silicon chip or to pads on the substrate circuit. However, ball-bonding has a number of advantages over bonding using wedge tools.

The formation of a ball on the end of a wire for bonding purposes by the application of a voltage across a gap can be extended to permit bonding with wires of larger diameter than those referred to above, for example with wire diameters of 200 μm. Gold and aluminium wires of this diameter might be used in high power electronic circuits, for example. The method can also be extended to the use of other wire materials (e.g. copper or steel) and to bonding uses outside the electronic field. For such wire diameters, however, the combination of voltage (for example 750 volts) and capacitance (e.g. 18 μF) could cause an unpleasant electrical shock.

A method according to the present invention, for forming a ball on a wire by spark discharge, comprises: initiating the formation of an arc between an electrode and the wire on which the ball is to be formed by applying between them a high voltage from a high-voltage low-current source which is effective only until the arc is formed; and, once the arc has been formed, drawing current for forming the ball from a high-current low-voltage source.

Apparatus according to the invention for carrying out this method comprises; an electrode; a wire holder for supporting a wire to form a gap between the tip of the wire and the electrode, across which gap the spark discharge is to take place; first and second supply circuits, the first supply circuit providing a higher voltage and a lower current than the second supply circuit; and circuit means for initially connecting the first higher-voltage circuit across the wire and electrode to provide a high-voltage low current between them to initiate an arc discharge and for thereafter connecting the second lower voltage source across the arc to pass a low-voltage high current across the gap between the wire and the electrode and thereby to form the ball; the higher-voltage circuit being effective only until the arc is formed.

As an example, one side of a low-voltage high capacitance source and one side of the high-voltage low-capacitance source can be connected to a wire or the electrode through a common SCR and switching means may be provided to fire the SCR and thereby connect the source across the gap. Simultaneously with the firing of the SCR, a switch in the lower-voltage source can be opened.

It has previously been proposed, for arc stabilisation in welding circuits, to connect a high-voltage low-current source and a low-voltage high-current source across an arc in such a manner that if conditions are such that the arc needs a higher voltage to prevent its extinction, it can obtain this higher voltage from the high-voltage source, although in the absence of such a need, the arc is supplied from the low-voltage source. In this case however, the high voltage source was permanently available to prevent extinction of the arc. In the present invention, the circuit is such that the high voltage source is substantially ineffective once the arc has been formed and cannot prevent subsequent extinction of the arc. It will not have recharged in time.

In order that the invention may be better understood, two methods and apparatus embodying the invention will now be described with reference to the accompanying drawings, in which.

Figure 1:
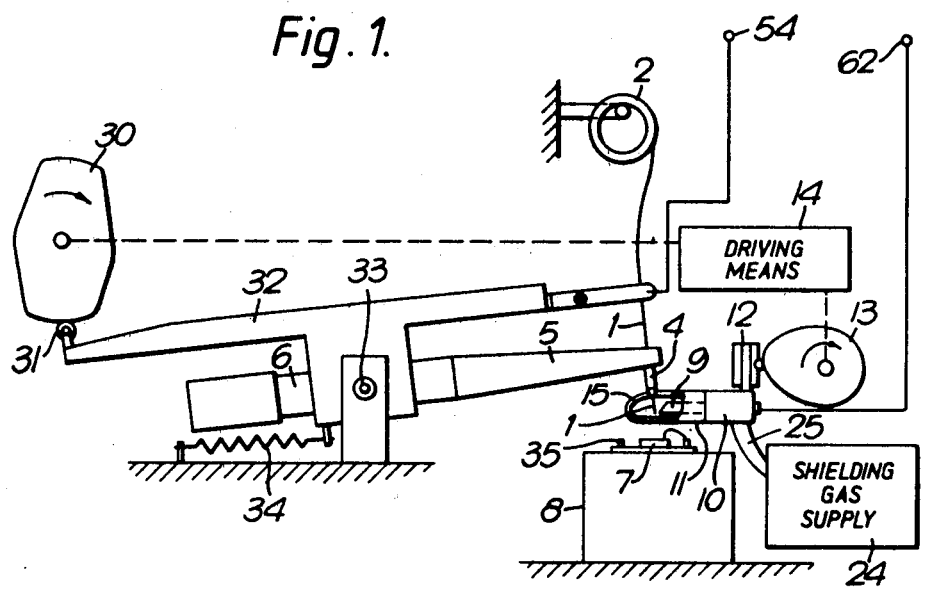
FIG. 1 shows apparatus for supporting a wire and an electrode in position to form the gap.

To form a ball on the end of the wire, a spark discharge is created between the tip of the wire 1 and an electrode 9 across a gap of about 0.005 ins (0.125 mm). The electrode 9 is supported in a holder 10 formed with a transparent forward portion 11 (shown in section in the drawing) and is mounted on the end of a pivoted arm 12. A cam 13 rotated by means of a driving means 14 pivots the arm 12 to advance the electrode to the position shown in FIG. 1 for ball formation, and then permits the arm 12 to retract to permit bonding. The transparent forward portion of the electrode holder 10 is formed with a slot 15 to permit the nozzle tip and wire to pass into the electrode holder as it is advanced.

A shielding gas supply 24 is connected through a tube 25 to the interior of the electrode holder, for use when required (e.g. with aluminium wire). During the arc discharge, shielding gas flows along the electrode to the wire tip and out through the slot 15.

The spark discharge between the wire and electrode results in the formation of a ball on the end of the wire. As the cam 13 continues to rotate, the electrode is withdrawn.

The driving means 14 also drives a cam 30. The cam 30 acts through a follower 31 to pivot an arm 32, on the end of which the conductive clamp 3 is mounted, about an axis 33. The ultra-sonic transducer assembly 6 also pivots about the axis 33. In the position shown in FIG. 1, the cam 30 has pivoted the arm 32 and transducer assembly 6 to raise the conductive clamp 3 and the capillary nozzle 4 above the work-piece to permit formation of the ball. When the ball has been formed, the cam 30 is rotated to allow the conductive clamp 3 and capillary nozzle 4 to pivot downwards to bring the ball into contact with the micro-circuit. A spring 34 maintains the follower 31 in contact with the cam 30. The ultra-sonic transducer 6 is then energised and acts through the ultra-sonic horn 5 to vibrate the nozzle 4 and therewith the ball on the end of the wire against the micro-circuit, to form an ultra-sonic bond in a known manner.

When the wire has been joined to the micro-circuit in the manner described above, it can be connected to a lead-out terminal 35. The manner of connecting the wire to the terminal 35 forms no part of the present invention; in practice, wedge bonding can be used because the bonding area available is larger. For the connection to the micro-circuit, the bonding area available is small and the amount of energy required to make the bond is more critical. If desired, the capillary nozzle 4 can be used to make the wedge bond to the lead-out terminal in known manner.

Figure 2:
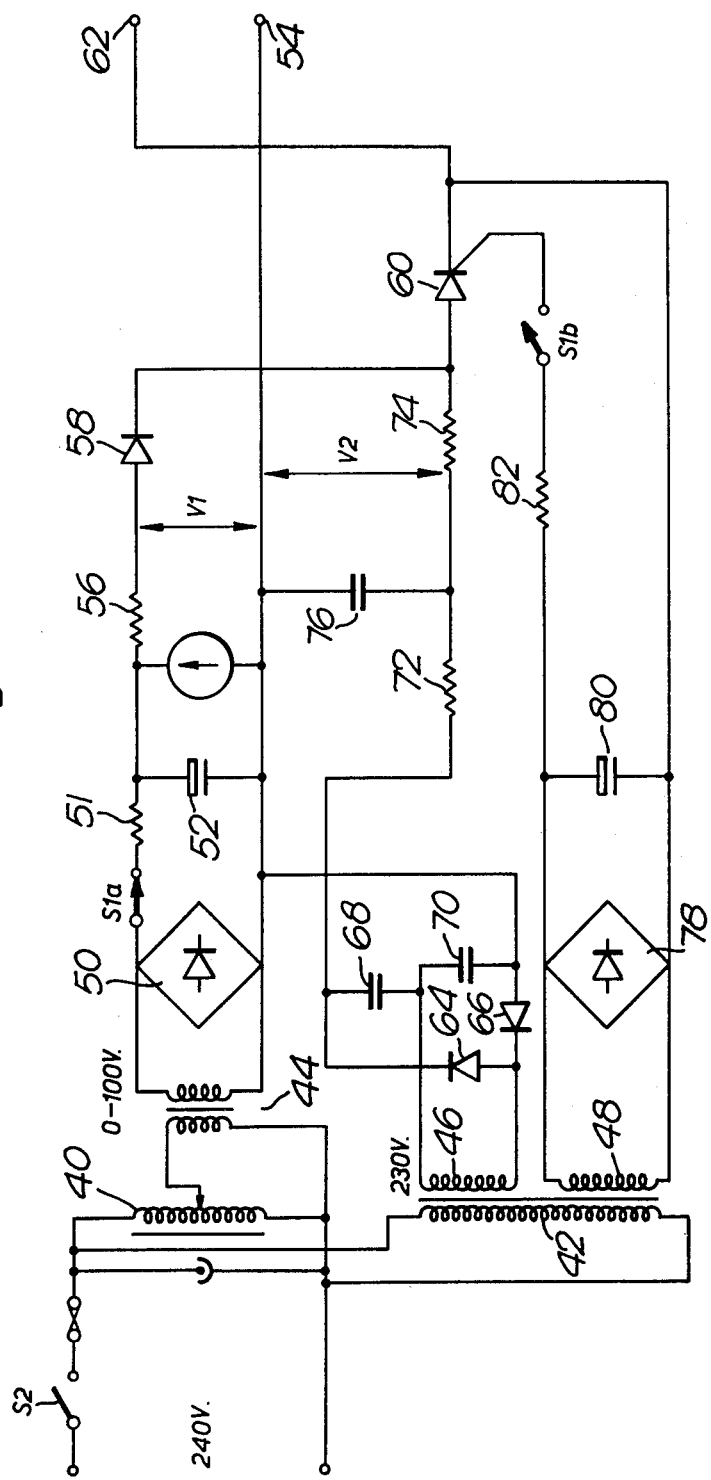
FIG. 2 shows a circuit for connection between the wire and the electrode, according to a first embodiment of the invention.

In FIG. 2, which shows the first embodiment of the invention, a 240-volts supply is connected across two parallel windings 40 and 42. The winding 40 is the winding of a variable ratio transformer with its wiper connected to a further transformer 44. The winding 42 has two secondary windings 46 and 48.

For the low-voltage supply, the winding 44 is connected through a full-wave rectifier 50, a switch S1a and a resistor 51 of 33 ohms to a capacitor 52, which in this example has a value of 14,000 microfarads. On the output side of the capacitor, one wire extends directly to an output terminal 54 and the other through a 2.8 ohm resistor 56, a rectifier 58 and a thyristor 60 to the other output terminal 62. The output terminals 62 and 54 are connected to the correspondingly numbered terminals in FIG. 1.

The high-voltage supply is provided by the secondary winding 46 with the aid of a voltage doubler including the rectifiers 64 and 66 and the capacitors 68 and 70. One side of the voltage doubler is connected directly to the output terminal 54. The other side is connected through a resistor 72 of 1 megohm, a resistor 74 of 200 ohms and the thyristor 60 to the output terminal 62. A capacitor 76, with a value of 0.005 microfarad is connected between the junction of the resistors 72 and 74 and the output line connected to terminal 54.

The winding 48 provides the control voltage for the thyristor 60. It is connected through a full wave rectifier 78 across a capacitor 80 (470 microfarad), one side of which is connected directly to the cathode of the thyristor 60 and the other side of which is connected through a resistor 82 and switch S1b (coupled to the switch S1a) to the gate of the thyristor.

To form the ball, switch S2 in the supply circuit for the transformer 40 and 42 is closed to energise the circuits. Capacitor 52 charges through its 33 ohm resistor to a voltage of, for example, 60 volts. Capacitor 76 charges through its 1 megohm resistor 72 to a high voltage (for example 660 volts). Capacitor 80 charges to a voltage adequate for firing the thyristor 60.

The coupled switches S1a and S1b are then opened and closed respectively; switch S1a leaves the large capacitor 52 in a charged condition and the closure of S1b results in the firing of thyristor 60 and provides a conductive path to discharge the high voltage capacitor 76 across the gap between the wire and the electrode and thus to form an arc. Once capacitor 76 has been discharged, it cannot recharge to the high voltage level within the period of the ball-forming cycle because of the high value of resistor 72. Also, capacitor 76 cannot supply a high current to the gap because of the resistor 74, the value of which (200 ohms) is large compared with the value of resistor 56 (2.8 ohms) in the low voltage circuit. When the thyristor fires, initially the diode 58 is reverse-biased by the high voltage across the output terminals of the circuit and isolates the capacitor 52 from the output terminals. Once capacitor 76 has discharged, the voltage across the gap falls and when it reaches a value that is lower than the charge voltage of capacitor 52, this capacitor 52 will then discharge by way of the diode through the gap with a much higher current than was provided by capacitor 76; this forms the ball on the wire.

Neither the low-voltage source, in combination with high-capacitance, nor the high-voltage source in combination with the small capacitance and high charging and discharging resistances, is likely to constitute a hazard to an operator; the high resistances in the high voltage circuit means that the high voltage does not exist, in effect, once the arc has been formed.

The voltage of the low-voltage source should preferably be under 100 v, in order to conform to safety standards. British Standard 638: Part 2: 1979 requires that in apparatus such as this the "no-load voltage" shall not exceed 100 v (means value) for d.c. equipment with ripple $\leq 10\%$. This requirement is also found in the Final Harmonization Document Concerning the No-load voltage of Arc-Welding Equipment, Cenelec 26 (SEC) 23E, June 1973. In order to maintain the arc, a voltage of at least 40 v is generally necessary.

Figure 3:
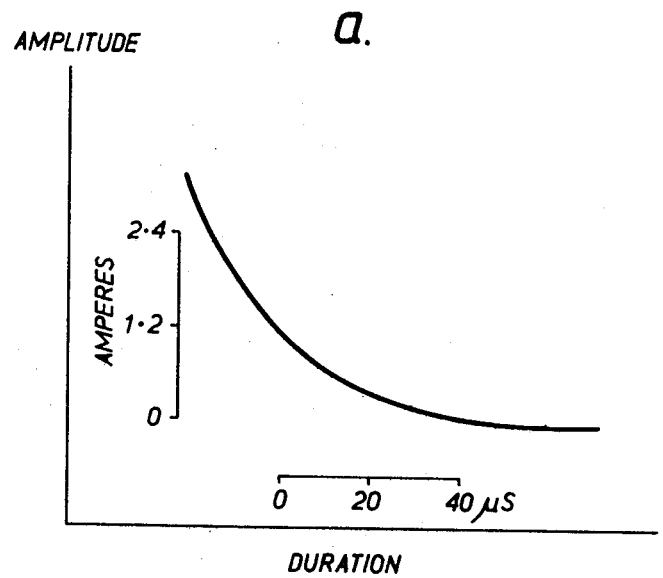
FIGS. 3A and 3B are graphs of the current output from the circuit of FIG. 2 when connected across a resistive load.
Figure 3:
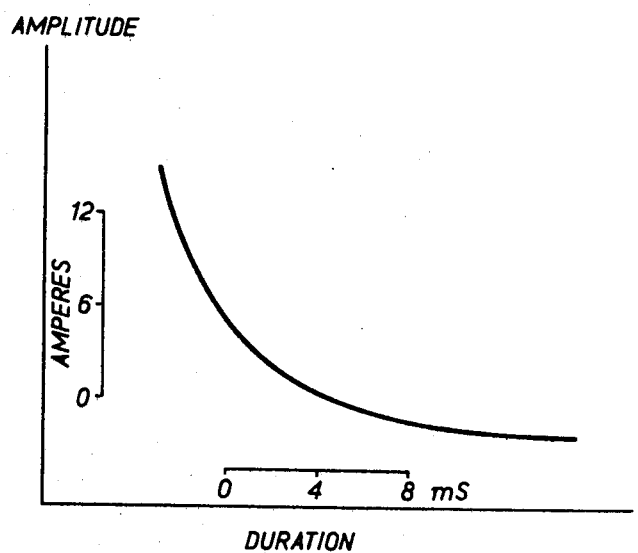

FIG. 3A is a graph of current against time for the initial, short stage of the discharge cycle at high voltage. The second, longer stage is shown in FIG. 3B. Because of the difficulty in measuring these currents across an arc, they were measured instead across a resistive load. For a capacitor 52 of $1.1 \times 10^3$ $\mu$F and a resistor 56 of 2.8$\Omega$, the current drops by a time constant (to 63%) in around 3 ms, in FIG. 3B.

The use of shielding gas when a ball is to be formed on an aluminium wire has already been mentioned. As explained in our British patent application No. 31346/77 the problem initially experienced in applying ball bonding to aluminium wire using the spark discharge technique was that the ball which formed was heavily oxidized and could not be used. When an attempt was made to form a ball on aluminium wire in a protective atmosphere, a glow discharge resulted without the formation of a ball. This was overcome by making the circuit resistance such that the peak current density in the wire section was from $1.2 \times 10^9$ A/m$^2$ to $13.5 \times 10^9$ A/m$^2$. Such current densities were from 40 to 400 times that which has been conventionally used for ball-bonding gold wire.

Examples of voltage and capacitance values used for different materials and different diameter wires are shown in the following table:

| Material | Diameter | Initial C ($\mu$F) | Discharge V | Power C ($\mu$F) | Discharge V |
|---|---|---|---|---|---|
| Al/5% Mg | 200 $\mu$m | 0.005 | 660 | 1,100 | 45 |
| Al (CP) (95.5% pure) | 500 $\mu$m | 0.005 | 660 | 8,000 | 50 |
| Au | 500 $\mu$m | 0.005 | 660 | 14,000 | 50 |
| Fe | 400 $\mu$m | 0.005 | 660 | 14,000 | 50 |
| Cu | 200 $\mu$m | 0.005 | 660 | 1,000 | 60 |

The invention can also be used for ball forming on steel, platinum and cupro-nickel wires.

It has also been found that the quality of the ball formed on aluminium and its alloys is better if the wire is of negative polarity and the ball formed appears to be larger, when other conditions are equal, than that formed on a wire of positive polarity. However, the converse is true of iron, for which it is preferable to make the wire positive. With the noble metals (for example platinum and gold) balls of good quality can be made with either polarity, the main difference being in the size of the ball; with these metals, a positive polarity for the wire results in a larger ball than a negative wire polarity.

I claim:

1. Apparatus for forming a ball on a wire by spark discharge to permit ball bonding of the wire to a component or terminal, comprising:
    an electrode;
    a wire holder for supporting a wire to form a gap between the tip of the wire and the electrode, across which gap the spark discharge is to take place;
    first and second D.C. supply circuits, the first supply circuit providing a higher voltage and a lower current than the second supply circuit; the first and second supply circuits including first and second capacitors, each connected across its respective supply circuit, the first capacitor being very small in relation to the second capacitor, the first and second supply circuits each including charging and discharging resistances for their respective capacitors, the values of the charging and discharging resistances in the first supply circuit being much larger than the values of the resistances in the second supply circuit;
    a switch connected between the second lower-voltage supply circuit and the second capacitor;
    and circuit means for initially connecting the first higher-voltage circuit across the wire and electrode to provide a high-voltage low current between them to initiate an arc discharge and for thereafter connecting the second lower-voltage source across the arc to pass a low-voltage high current across the gap between the wire and the electrode and thereby to form the ball;
    the higher-voltage circuit being effective only until the arc is formed;
    means operable to bring the ball so formed into contact with a micro circuit; and
    means for bonding the ball to the micro circuit.

2. A method of forming a ball on a wire to permit ball bonding of the wire to a component or terminal, the method including connecting an electrical supply circuit across a gap between an electrode and the wire to form the ball by spark discharge across the gap, and further comprising:
    prior to the ball-forming operation, charging a small capacitance in a low-current source to a high voltage through a charging circuit including a high first resistor and charging a large capacitance in a high-current source to a low voltage through a charging circuit including a much smaller second resistor;
    thereafter, opening the charging circuit for the low-voltage capacitance and closing the discharge circuits of both capacitances across the gap, whereby in a first period the discharge of the small high-voltage capacitance initiates the formation of an arc across the gap, and then in a second period longer than the first period the large low-voltage capacitance discharges across the arc gap to form the ball on the end of the wire to complete the operation, the first resistor being of a value such that the small capacitance does not recharge to the said high voltage during the said second period.

3. Apparatus for forming a ball on a wire by spark discharge to permit ball bonding of the wire to a component or terminal, and including an electrode, a wire holder for supporting a wire to form a gap between the tip of the wire and the electrode, across which gap the spark discharge is to take place, the apparatus further comprising:
    a high-voltage low-current first electrical supply circuit connected across the gap and including a first capacitance and charge and discharge circuits for the first capacitance, the charge circuit including a first resistance of high value;
    a low-voltage high current second electrical supply circuit connected across the gap and including a second capacitance much larger than the first capacitance, and charge and discharge circuits for the second capacitance, the charge circuit for the second capacitance including switching means and the discharge circuits of the two capacitances having switching means;
    the switching means for the discharge circuits of the two capacitances being closed when the switching means for the charging circuit of the second capacitance is open and vice versa, whereby both capacitances charge when the switching means of the first charge circuit is closed, and with the switching means of the discharge circuits closed the high voltage first supply circuit initiates an arc discharge and thereafter the lower-voltage second supply source discharges through the arc to form a ball on the end of the wire, the time constant of the discharge circuit for the second source being long enough to permit the formation of the ball on the wire end, the said high-valued first resistance preventing the first capacitance from recharging to a high voltage during the formation of the ball.

4. Apparatus in accordance with claim 3 in which the switching means for the discharge circuits comprises a common controlled rectifier, one side of the lower voltage source and one side of the higher voltage source being connected to the wire or to the electrode through the common controlled rectifier, and in which switching means are provided to fire the controlled rectifier and thereby connect the sources across the gap.

5. Apparatus in accordance with claim 3, in which the capacitance in the second supply circuit is not greater than 0.1 microfarad.

6. Apparatus in accordance with claim 3, in which the capacitance of the capacitor in the second supply circuit is not less than 1000 microfarads.

7. Apparatus in accordance with claim 3, in which the voltage provided by the first supply circuit is between 350 volts and 10,000 volts.

8. Apparatus in accordance with claim 3, in which the first and second supply circuits are electronic constant-current sources.

9. Apparatus in accordance with claim 1 or 4, in which the voltage provided by the second supply circuit is between 40 volts and 100 volts.

* * * * *